United States Patent [19]

Moskowitz

[11] 4,210,874
[45] Jul. 1, 1980

[54] GAIN CONTROL AMPLIFIER CIRCUIT

[75] Inventor: Jacob F. Moskowitz, Kensington, Md.

[73] Assignee: Raytheon Company, Lexington, Mass.

[21] Appl. No.: 953,821

[22] Filed: Oct. 23, 1978

[51] Int. Cl.² .............................................. H03G 3/26
[52] U.S. Cl. ..................................... 330/134; 330/136
[58] Field of Search ............... 330/129, 134, 136, 279, 330/304

[56] References Cited

U.S. PATENT DOCUMENTS

| 3,781,703 | 12/1973 | Duty | 330/52 |
| 3,900,823 | 8/1975 | Sokal et al. | 330/149 |
| 3,918,003 | 11/1975 | Seidel | 330/52 X |
| 3,965,436 | 6/1976 | Dixon | 330/279 X |
| 4,035,739 | 7/1977 | Dickopp et al. | 330/129 |

*Primary Examiner*—James B. Mullins

*Attorney, Agent, or Firm*—M. D. Bartlett; J. D. Pannone; H. W. Arnold

[57] ABSTRACT

An amplifier having a gain control terminal amplifies an input signal to produce an output signal of a desired magnitude. A gain control circuit coupled between the input and output signals and to the control terminal includes detectors of the input and output signal amplitudes. The control circuit further includes a first impedance network connected to the control terminal and a feedback circuit connected in series therewith, the feedback circuit including a second impedance network complementary to the first impedance network. A feedback signal of the feedback circuit is multiplied by the amplitude of the input signal and combined with the amplitude of the output signal and a reference signal at a summing point of the feedback circuit to maintain a response time of the control circuit which is essentially invariant with respect to the amplitude of the input signal.

2 Claims, 1 Drawing Figure

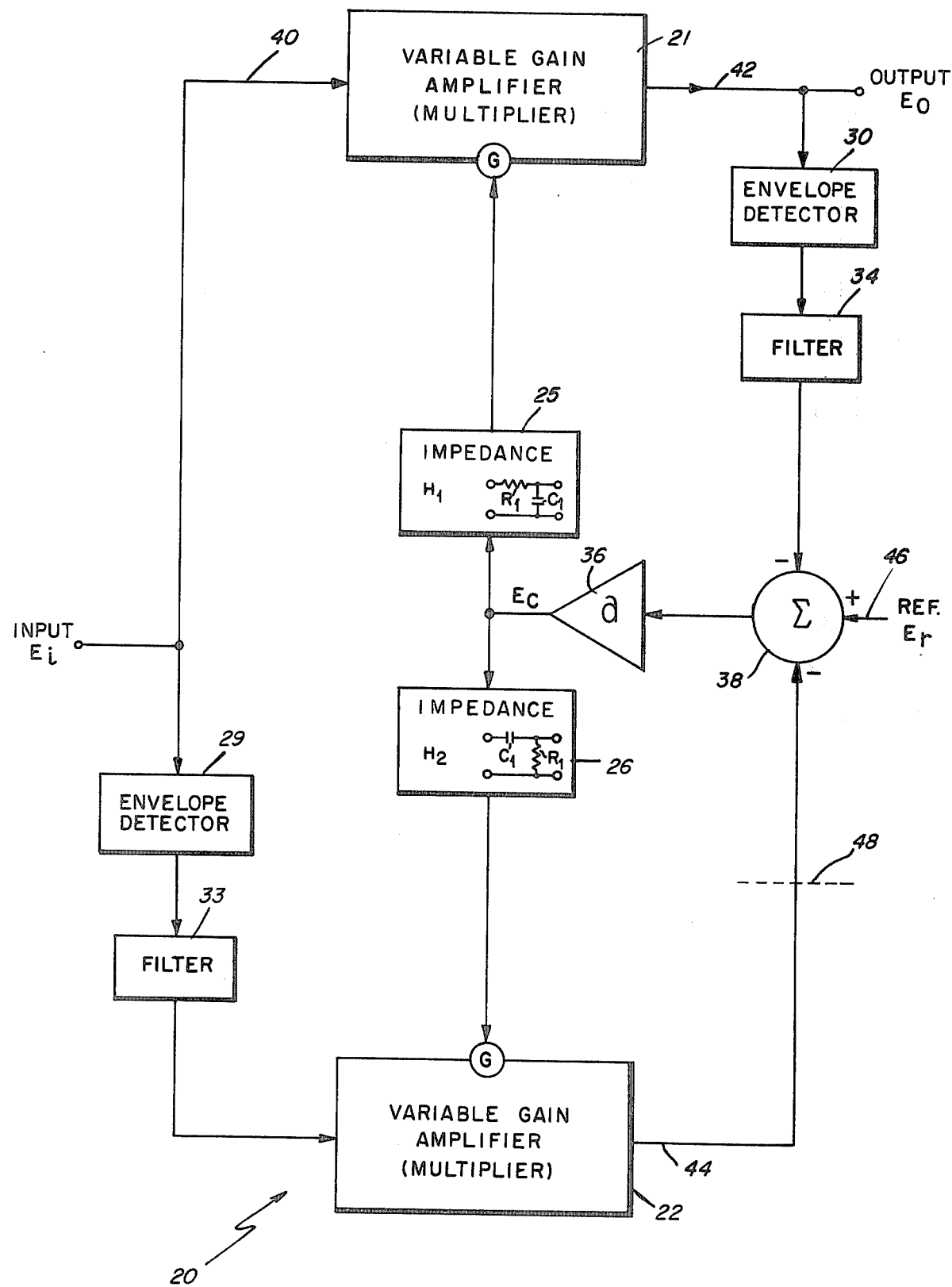

GAIN CONTROL AMPLIFIER CIRCUIT

BACKGROUND OF THE INVENTION

Gain controlled amplifiers are used extensively in radar, sonar and communication systems for amplifying an input signal to a desired amplitude. Since the input signal amplitude may vary over a wide range, the gain of the amplifier is correspondingly varied to compensate for the amplitude variation of the input signal to provide the desired amplitude of the output signal.

A problem arises in that the gain control circuit acts as a multiplier wherein the difference between the output signal amplitude and that of a reference signal is multiplied by the amplitude of the input signal, the multiplication taking effect by virtue of the gain of the amplifier. Thus, the loop gain and dynamic response of the gain control circuit are dependent on the amplitude of the input signal. As a result, such gain control circuits are restricted in the controlling of the gain since the dynamic response of the control circuit varies as a function of the input signal amplitude.

SUMMARY OF THE INVENTION

The aforementioned problem is overcome and other advantages are provided by a gain control circuit for a variable gain amplifier having an input terminal, an output terminal, and a gain control terminal. In accordance with the invention, the gain control circuit comprises a first detecting circuit coupled to the input terminal for detecting the amplitude of an input signal at the input terminal, a second detecting circuit coupled to the output terminal for detecting the amplitude of an output signal at the output terminal, and a filter circuit coupled between output terminals of the first and second detecting circuits, the filter circuit having first and second impedance networks for providing a control signal which is applied to the control terminal of the variable gain amplifier. The first and second impedance elements are complementary to each other. The second impedance element is contained within a feedback circuit of the filter circuit, the feedback circuit being serially connected with the first impedance element. The feedback circuit includes a multiplier and a summer, a feedback signal of the feedback circuit being multiplied by the amplitude of the input signal with the product thereof being applied to the summer. The amplitude of the output signal and a reference signal are also applied to the summer. The complementary properties of the impedance networks in combination with the scaling of the feedback signal by the input signal amplitude results in a diminution of the loop gain of the gain control circuit corresponding to an increase in the input signal amplitude, this resulting in a frequency response, or response time, of the gain control circuit which is essentially invariant with variations in the input signal amplitude.

BRIEF DESCRIPTION OF THE DRAWING

The aforementioned aspects and other features of the invention are explained in the following description taken in connection with the accompanying drawing wherein the FIGURE is a block diagram of the gain control circuit of the invention.

DESCRIPTION OF THE PREFERRED EMBODIMENT

Referring now to the FIGURE, there is seen a circuit 20 of an automatic gain control (AGC) amplifier system comprising amplifiers 21-22, impedance networks 25-26, envelope detectors 29-30, filters 33-34, an amplifier 36 and a summing junction to be referred to hereinafter as a summer 38. Each of the amplifiers 21-22 has a gain control terminal G to which a gain control signal is applied for varying the gain of the respective amplifiers 21-22. Thus, with reference to the amplifier 21, the amplitude of an input signal on line 40 is multiplied by the gain of the amplifier 21, the multiplying factor being proportional to the amplitude of the signal at terminal G provided by the network 25. Thus, the amplifier 21, as well as the amplifier 22, may be regarded as multipliers, the product produced by the amplifier 21 appearing as the output signal on line 42. Similarly, with reference to the amplifier 22, the amplitude of a signal of the filter 33 is multiplied by a factor proportional to the amplitude of a signal from the network 26 to provide the product on line 44.

The circuit 20 is constructed in a symmetrical configuration such that the input signal 40 is applied to each of the amplifiers 21-22. The output signals of the two amplifiers 21-22 on lines 42 and 44, respectively, are applied to the summer 38. The two networks 25-26 are coupled in a symmetrical configuration respective to the amplifiers 21-22 and are driven by the output sum signal of the summer 38, the sum signal being coupled via the amplifier 36 to the networks 25-26. Assuming the input and output signals on lines 40 and 42 to be of a generally sinusoidal shape of varying amplitude as is generally found in radar sonar, and communication systems, the amplifier 21 serves as the main amplifier for amplifying the waveform of the signal on line 40 while the amplifier 22 and the summer 38 operate with the amplitude of the envelope of the signals on lines 40 and 42, respectively.

The detectors 29 and 30 detect the amplitudes of the envelopes of the signals on lines 40 and 42. The filters 33 and 34 are low pass filters which serve to smooth the envelopes of the input and output signals, the pass bands of the filters 33-34 being larger than the pass bands of the networks 25-26 so as to have no more than a negligible effect on the closed-loop response time of the circuit 20.

The networks 25-26 have complementary impedances; thus, the sum of the impedance $H_1$ of the network 25 and the impedance $H_2$ of the network 26 are equal to unity. Both the impedances $H_1$ and $H_2$ are understood to be functions of the complex frequency s. An exemplary pair of circuits having the complementary relationship are shown in the FIGURE; the network 25 is shown as a low pass circuit comprising a series resistor and a shunt capacitor with transfer function $H_1$, and the network 26 is shown as a high pass circuit comprising a series capacitor and a shunt resistor and having a transfer impedance $H_2$.

In accordance with the invention, the gain of each of the amplifiers 21-22 is proportional to the amplitudes of the signals applied to their respective input terminals, the proportionality factor, k, having the same value for each of the amplifiers 21-22. As will be explained subsequently in a mathematical description, the amplitude of the input signal appears in both feedback loops, namely, the upper loop comprising the amplifier 36, the network 25, the amplifier 21, and the summer 38, as well as the lower loop comprising the amplifier 36, the network 26, the amplifier 22 and the summer 38. A reference signal, $E_r$, is applied via line 46 to the summer 38 to serve as a reference in each of the feedback loops to which the output signals of the amplifiers 21-22 are compared. The output signals of the amplifiers 21-22 are algebraically summed at the summer 38, the minus signs indicating subtraction from the reference signal on line 46 to produce the aforementioned sum signal. The sum signal serves as a loop error signal for each of the loops, the error signal being multiplied by the amplifier 36 to provide, via the networks 25-26, the magnitudes of the respective gain control factors.

In accordance with the invention, the magnitude of the input signal appears as one of the multiplying factors in the output signal on line 42. However, in view of the complementary relationship between the networks 25-26, the appearance of the input signal amplitude as a multiplying factor in the resonse times of each of the networks 25-26 is seen to cancel so that the overall response of the two loops of the circuit 20 is free of time constants dependent on the magnitude of the input signal on line 40. Accordingly, a specific signal waveform is processed by the loop 20 independently of the amplitude of the input signal over the entire operating range of the circuit 20. Since the response time of the circuit 20 is the same for small signals as well as for large signals, the fidelity of the signal waveform is retained during any fading of the signal while the average amplitude of the signal waveform is maintained substantially equal to that of the reference signal on line 46. The foregoing operation will be further explained in the following mathematical description wherein the output signal is represented by $E_o$, the input signal is represented by $E_1$, and the amplifier 36 has a gain of a and an output signal Ec.

Mathematical Description

The response of the circuit 20 to the input signal $E_i$ may be found by expressing the output signal $E_c$ of the amplifier 36 in terms of the reference signal $E_r$, the impedance functions $H_1$ and $H_2$, and the proportionality factor k in each of the amplifiers 21-22 by the relationship.

$$Ec/a = E_r - E_c H_1 E_i k - E_c H_2 E_i k \qquad (1)$$
$$= E_r - E_c E_i k (H_1 + H_2)$$
$$= E_r - E_c E_i k$$

where $H_1$ and $H_2$ are complementary and, accordingly $H_1 + H_2 = 1$, and where $$E_0 = E_c H_1 E_i k \qquad (2)$$

Transposing the terms of Equation 1 gives $$\frac{E_c}{E_r} = \frac{a}{1 + aE_i k} \simeq \frac{1}{E_i k} \qquad (3)$$

where $aE_i k << 1$.
Combining Equations 2 and 3 gives $$E_o = E_r H_1 \qquad (4)$$

from which it is seen that the frequency responsive term $H_1$ is independent of input signal amplitude. The effect of the complementary impedance configuration of the FIGURE may be further demonstrated by cutting the circuit at the dashed line 48 whereupon it is seen that $$(E_r - E_o) a H_1 E_1 k = E_o \qquad (5)$$

and, upon transposing the terms, and substituting
$$H_1 = (R_1 C_1 s + 1)^{-1} \qquad (6)$$

there results $$E_o = E_r \left[ \frac{a E_i k}{R_1 C_1 s + 1 + a E_i k} \right] \qquad (7)$$

The frequency resonsive term in the brackets of Equation 7 is dependent on the input signal amplitude $E_1$. Equation 7 is representative of the prior art and shows the dependency of the frequency response on input signal amplitude. Equation 4 shows that the complementary impedance configuration of the invention removes the dependency of frequency response on the input signal amplitude.

It is understood that the above-described embodiment of the invention is illustrative only and that modifications thereof may occur to those skilled in the art. Accordingly, it is desired that the invention is not to be limited to the embodiment disclosed herein but is to be limited only as defined by the appended claims.

What is claimed is:

1. A gain control circuit for controlling the gain of a variable gain amplifier having input, output and gain control terminals comprising:
   first and second means for detecting the amplitudes, respectively, of an input signal at said input terminal and an output signal at said output terminal;
   filtering means coupled between said first and said second detecting means for applying a signal to said control terminal, said filtering means including a feedback circuit and a first impedance means coupled between said feedback circuit and said gain control terminal;
   said feedback circuit including a second impedance network complimentary to said first impedance network;
   said feedback circuit further comprising a multiplying means coupled between said first detecting means and an output terminal of said second impedance network; and
   wherein said feedback circuit further comprises a summing means coupled between said second detecting means and an output terminal of said multiplying means, said summing means combining the amplitude of said output signal and a reference signal with the product of the input signal amplitude times a signal of said second impedance network to provide a sum signal to input terminals of said first and said second impedance networks 2. A gain control circuit for controlling the gain of a variable gain amplifier having input, output and gain control terminals comprising:
   first and second means for detecting the amplitudes respectively of an input signal at said input terminal and an output signal at said output terminal;
   first and second impedance networks, an output terminal of said first impedance network being connected to said gain control terminal, an input terminal of said first impedance network being coupled to an input terminal of said second impedance network;

means for multiplying an output signal of said second impedance network by the amplitude detected by said first detecting means to produce a product; and means for combining said product with an amplitude detected by said second detecting means, an output terminal of said combining means being coupled to said input terminals of said first and said second impedance networks to provide a feedback loop comprising said second impedance network and said multiplying means, said multiplying means providing a gain to said loop which is proportional to said amplitude detected by said first detecting means.

* * * * *